US012610816B2

(12) United States Patent
Yuki et al.

(10) Patent No.: US 12,610,816 B2
(45) Date of Patent: Apr. 21, 2026

(54) INSULATING SUBSTRATE AND MANUFACTURING METHOD THEREOF

(71) Applicant: DOWA METALTECH CO., LTD., Tokyo (JP)

(72) Inventors: Seiya Yuki, Nagano (JP); Takashi Ideno, Nagano (JP); Junichi Kinoshita, Mie (JP); Yukihiro Kitamura, Nagano (JP)

(73) Assignee: DOWA METALTECH CO., LTD., Tokyo (JP)

( * ) Notice: Subject to any disclaimer, the term of this patent is extended or adjusted under 35 U.S.C. 154(b) by 494 days.

(21) Appl. No.: 18/010,104

(22) PCT Filed: Jun. 29, 2021

(86) PCT No.: PCT/JP2021/024584
§ 371 (c)(1),
(2) Date: Dec. 13, 2022

(87) PCT Pub. No.: WO2022/014319
PCT Pub. Date: Jan. 20, 2022

(65) Prior Publication Data
US 2023/0268245 A1 Aug. 24, 2023

(30) Foreign Application Priority Data
Jul. 15, 2020 (JP) ................................. 2020-121493

(51) Int. Cl.
*H10W 40/25* (2026.01)

(52) U.S. Cl.
CPC ....... *H10W 40/255* (2026.01); *H10W 40/258* (2026.01)

(58) Field of Classification Search
CPC ... C04B 41/009; C04B 41/4572; C04B 41/52; C04B 37/026; C04B 2235/6581;
(Continued)

(56) References Cited

U.S. PATENT DOCUMENTS

| | | | | |
|---|---|---|---|---|
| 2004/0149689 A1* | 8/2004 | Ning | ...................... | H05K 3/243 257/E23.106 |
| 2018/0190568 A1* | 7/2018 | Naba | ..................... | C04B 37/026 |
| 2019/0385926 A1* | 12/2019 | Naba | ........................ | H05K 1/09 |

FOREIGN PATENT DOCUMENTS

| | | |
|---|---|---|
| EP | 3321957 | 5/2018 |
| EP | 3370488 | 9/2018 |

(Continued)

OTHER PUBLICATIONS

Extended European Search Report issued in European patent application No. 21842920.7, dated Jun. 21, 2024.

(Continued)

*Primary Examiner* — Brigitte A Paterson
(74) *Attorney, Agent, or Firm* — GREENBLUM & BERNSTEIN, P.L.C.

(57) ABSTRACT

An insulating substrate in which one principal surface of a heat-dissipation-side metal plate is brazed to one principal surface of a ceramic substrate via a brazing material layer provided therebetween, in which a Ni plating layer that covers the brazing material layer exposed between the ceramic substrate and the heat-dissipation-side metal plate is provided, and at least a portion of the other principal surface of the heat-dissipation-side metal plate is not covered with a Ni plating layer, leaving the surface of the heat-dissipation-side metal plate exposed. According to the present invention, it becomes possible to obtain the insulating substrate having excellent furnace passing resistance of the insulating substrate (alone) and further having excellent heat cycle characteristics in a state of a heat sink plate being soldered to the insulating substrate.

17 Claims, 3 Drawing Sheets

(58) Field of Classification Search
   CPC ...... C04B 2237/6581; C04B 2237/124; C04B
                  2237/125; C04B 2237/127; C04B
                  2237/366; C04B 2237/407; C04B
          2237/708; H05K 1/0209; H05K 1/0306;
              H01L 23/367; H01L 23/3735; H01L
                                              23/2736
   See application file for complete search history.

(56)                References Cited

FOREIGN PATENT DOCUMENTS

| JP | 9-17918 | | 1/1997 |
| JP | 2001-24296 | A | 1/2001 |
| JP | 2002-9212 | A | 1/2002 |
| JP | 2006-228918 | A | 8/2006 |
| JP | 2006-351988 | | 12/2006 |
| JP | 2009-70863 | A | 4/2009 |
| JP | 2010-241627 | A | 10/2010 |
| JP | 2011-97049 | A | 5/2011 |
| JP | 2011-181634 | A | 9/2011 |
| JP | 2016-76603 | A | 5/2016 |

OTHER PUBLICATIONS

Extended European Search Report issued in European patent application No. 21842432.3, dated Jun. 11, 2024.
International Search Report issued in International Bureau of WIPO Patent Application No. PCT/JP2021/024584, dated Sep. 28, 2021, along with an English translation thereof.

* cited by examiner

INSULATING SUBSTRATE AND MANUFACTURING METHOD THEREOF

TECHNICAL FIELD

The present invention relates to an insulating substrate to be used for a semiconductor power module, and the like and a manufacturing method thereof.

BACKGROUND ART

For example, as described in Patent Document 1, an insulating substrate used for a semiconductor power module or the like is configured in which copper plates are brazed to both surfaces of a ceramic substrate made of AlN, $Al_2O_3$, $Si_3N_4$, or the like with a brazing material layer. Then, the copper plate on the circuit side is set as a predetermined copper circuit, an electronic component such as a semiconductor chip is soldered to the copper plate, and a heat sink plate (base plate) made of Cu, Al, or other material with excellent thermal conductivity is soldered to the copper plate on the heat dissipation side to fabricate a semiconductor power module, or the like.

Regarding such an insulating substrate, for example, as described in Patent Document 2, as the insulating substrate, there has been used a metal-ceramic insulating substrate in which a metal plate is bonded to a ceramic substrate using a brazing material containing Ag, Cu, and an active metal. Further, as described in Patent Document 3, in order to improve soldering of electronic components or a heat sink plate and improve corrosion resistance, coating the entire copper plate with Ni plating has been performed.

PRIOR ART DOCUMENT

Patent Document

Patent Document 1: Japanese Laid-open Patent Publication No. 2009-70863
Patent Document 2: Japanese Laid-open Patent Publication No. 2010-241627
Patent Document 3 Japanese Laid-open Patent Publication No. 2001-24296

DISCLOSURE OF THE INVENTION

Problems to be Solved by the Invention

In an insulating substrate formed of a metal plate such as a Cu plate and a ceramic substrate such as an AlN substrate being bonded together, a heat-dissipation-side metal plate is formed on one principal surface of the ceramic substrate and a circuit-side metal plate (circuit pattern) is formed on the other principal surface of the ceramic substrate, and the ceramic substrate and the heat-dissipation-side metal plate are bonded together via a brazing material layer provided therebetween and the ceramic substrate and the circuit-side metal plate are bonded together via a brazing material layer provided therebetween.

When the aforementioned insulating substrate is used as a substrate for a power module, a relatively thick (for example, about 2 to 5 mm) heat sink plate (base plate) made of Cu, for example, is bonded to the surface (the other principal surface) of the aforementioned heat-dissipation-side metal plate by soldering, and electronic components such as semiconductor chips and terminals are mounted on the surface (the other principal surface) of the aforementioned circuit-side metal plate by soldering, ultrasonic bonding, or the like. Further, after wiring of power semiconductors and other components by bonding or the like is completed, processes such as a resin case is formed on the heat sink plate so as to surround the insulating substrate, the case is filled with a gel material for sealing, closing a lid of the case are performed, and then a power module is manufactured.

The insulating substrate is required to have reliability (furnace passing resistance) against the heat load (thermal history) generated in the above-described power module assembly process (in the insulating substrate alone). Further, in recent years, there has been an increasing demand for the insulating substrate to improve severe heat cycle characteristics at a higher temperature in a state of the heat sink plate being soldered to the insulating substrate.

However, the ceramic insulating substrates in Patent Documents 1 and 3 are not sufficient in the furnace passing resistance of the insulating substrate alone, and cracks may occur in the ceramic substrate after passing through a furnace. Although the insulating substrate in Patent Document 2 has excellent furnace passing resistance of the insulating substrate alone, it has been found out that cracking occurs in the ceramic substrate when a high-temperature heat cycle test is conducted in a state of the heat sink plate being soldered to the heat-dissipation-side metal plate of the insulating substrate.

The present invention has been made in consideration of such circumstances, and an object thereof is to provide an insulating substrate having excellent furnace passing resistance of the insulating substrate alone and further having excellent heat cycle characteristics at high temperatures in a state of a heat sink plate being soldered to the insulating substrate (namely, assuming a state of the insulating substrate being incorporated in a power module).

Means for Solving the Problems

The present inventors examined the factors that cause cracks to occur in the ceramic substrate. As a result, they speculated that brazing material layer dissolution by solder, in which when an electronic component or a heat sink plate is soldered to an insulating substrate, a component derived from the solder (for example, Sn) enters (diffuses into) the brazing material layer with the copper plate bonded thereto, to form brittle compounds with a brazing material component (such as, for example, Ag or Cu), can be a factor of cracks. Therefore, the present invention was designed so that Ni plating is used to prevent direct contact between the brazing material layer and the solder, thereby avoiding the diffusion of a solder component such as Sn into the brazing material layer.

According to the present invention, there is provided an insulating substrate in which one principal surface of a heat-dissipation-side metal plate is brazed to one principal surface of a ceramic substrate via a brazing material layer provided therebetween, in which a Ni plating layer that covers the brazing material layer exposed between the ceramic substrate and the heat-dissipation-side metal plate is provided, and at least a portion of the other principal surface of the heat-dissipation-side metal plate is not covered with a Ni plating layer, leaving the surface of the heat-dissipation-side metal plate exposed.

In this insulating substrate, a portion or all of a side surface of the heat-dissipation-side metal plate may be covered with the Ni plating layer. Further, a periphery of the other principal surface of the heat-dissipation-side metal plate may be covered with the Ni plating layer. Further, one principal surface of a circuit-side metal plate may be brazed to the other principal surface of the ceramic substrate via a brazing material layer provided therebetween. The circuit-side metal plate may be a copper plate or a copper alloy plate. Further, the heat-dissipation-side metal plate is a copper plate or a copper alloy plate.

Further, according to the present invention, there is provided a manufacturing method of an insulating substrate, the method including: in the insulating substrate in which one principal surface of a heat-dissipation-side metal plate is bonded to one principal surface of a ceramic substrate via a brazing material layer provided therebetween and one principal surface of a circuit-side metal plate is bonded to the other principal surface of the ceramic substrate via a brazing material layer provided therebetween, forming a plating resist on the other principal surface of the heat-dissipation-side metal plate; and immersing the insulating substrate on which the plating resist is formed in a Ni plating solution to form a Ni plating layer on the brazing material layer exposed between the ceramic substrate and the heat-dissipation-side metal plate on which the plating resist is not formed and then peeling the plating resist.

In this manufacturing method of the insulating substrate, a portion or all of a side surface of the heat-dissipation-side metal plate may be covered with the Ni plating layer. Further, a periphery of the other principal surface of the heat-dissipation-side metal plate may be covered with the Ni plating layer. This manufacturing method of the insulating substrate may further include: forming a plating resist on the other principal surface of the circuit-side metal plate to form a Ni plating layer on the brazing material layer exposed between the ceramic substrate and the circuit-side metal plate. Further, a portion or all of a side surface of the circuit-side metal plate may be covered with the Ni plating layer. Further, the heat-dissipation-side metal plate and the circuit-side metal plate each may be a copper plate or a copper alloy plate. Further, the brazing material layer may contain one metal component selected from Cu, Ag, and Sn, and contain one active metal component selected from Ti, Hf, and
Zr.

Effect of the Invention

According to the present invention, it becomes possible to obtain an insulating substrate having excellent furnace passing resistance of the insulating substrate (alone) and further having excellent heat cycle characteristics in a state of a heat sink plate being soldered to the insulating substrate.

EMBODIMENTS FOR CARRYING OUT THE INVENTION

Figure 1:
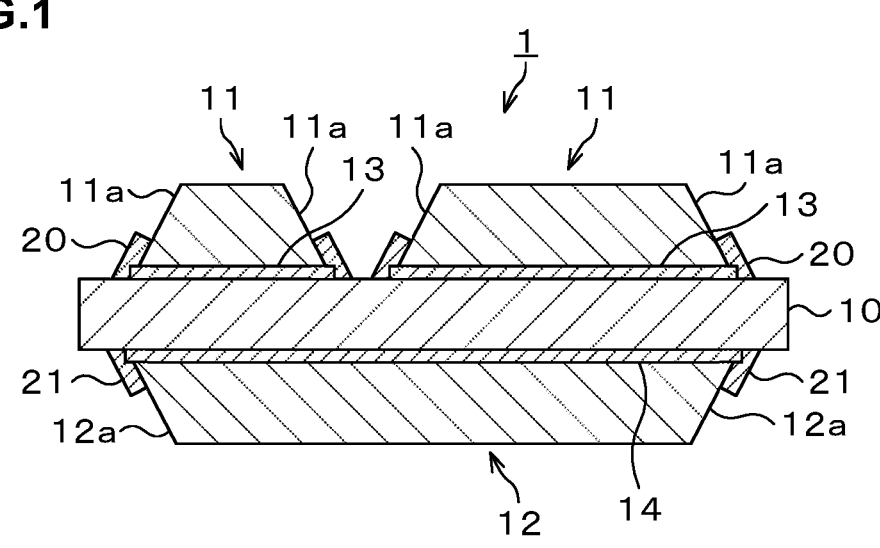
FIG. 1 is a cross-sectional view of an insulating substrate according to an embodiment of the present invention.

Hereinafter, one example of an embodiment of the present invention will be explained with reference to the drawings. Incidentally, in this description and the drawings, elements having substantially the same functional configuration are denoted by the same reference numerals and symbols, so that redundant explanations will be omitted.

As illustrated in FIG. 1, an insulating substrate 1 according to an embodiment of the present invention is an insulating substrate 1 in which one principal surface (surface) of a heat-dissipation-side metal plate 12 (made of copper, aluminum. or the like) is brazed to one principal surface (surface) of a (plate-shaped) ceramic substrate 10 made of AN, $Al_2O_3$, $Si_3N_4$, or the like via a brazing material layer 14 provided therebetween, in which a Ni plating layer 21 is provided to cover (an end portion) of the brazing material layer 14 exposed between the aforementioned ceramic substrate 10 and the aforementioned heat-dissipation-side metal plate 12 and at least a portion of the other principal surface of the aforementioned heat-dissipation-side metal plate 12 is not covered with a Ni plating layer, leaving the surface of the aforementioned heat-dissipation-side metal plate exposed.

Further, a portion or all of a side surface 12a of the aforementioned heat-dissipation-side metal plate 12 may be covered with the aforementioned Ni plating layer 21, and the periphery of the other principal surface (surface) of the aforementioned heat-dissipation-side metal plate 12 may be covered with the aforementioned Ni plating layer 21.

Further, one principal surface (surface) of a circuit-side metal plate 11 (made of copper, aluminum, or the like) is brazed to the other principal surface (surface) of the aforementioned ceramic substrate 10 via a brazing material layer 13 provided therebetween. Further, the aforementioned heat-dissipation-side metal plate 12 is preferably a copper plate or a copper alloy plate, and the aforementioned circuit-side metal plate 11 is preferably a copper plate or a copper alloy plate. Further, of the other principal surface of the aforementioned heat-dissipation-side metal plate 12, the region that is not covered with the Ni plating layer and has an exposed principal surface of the aforementioned heat-dissipation-side metal plate preferably has 70 area % or more, more preferably 80% or more, and further preferably 90% or more with respect to the area of the other principal surface of the aforementioned heat-dissipation-side metal plate.

Incidentally, FIG. 1 illustrates a state where one principal surface (surface) of the circuit-side metal plate 11 is brazed to the other principal surface (upper surface) of the ceramic substrate 10 by the brazing material layer 13 and one principal surface (surface) of the heat-dissipation-side metal plate 12 is brazed to one principal surface (lower surface) of the ceramic substrate 10 by the brazing material layer 14. The circuit-side metal plate 11 is formed to have a predetermined circuit shape, and an electronic component (not illustrated) such as a semiconductor chip is soldered to the circuit-side metal plate 11. Further, a heat sink plate (base plate, not illustrated) made of Cu or Al, which has excellent thermal conductivity, is soldered to substantially the entire surface of the other surface of the heat-dissipation-side metal plate 12 to fabricate a power module or the like.

In the case where such an insulating substrate 1 is used as a semiconductor power module, when the above-described semiconductor chip is soldered to the circuit-side metal plate 11 or the heat sink plate is soldered to the heat-dissipation-side metal plate 12, and further, when heat is generated repeatedly at a time when the semiconductor chip is energized, and at another event, due to a thermal stress generated by the difference between the thermal expansion coefficient between the ceramic substrate 10 and the circuit-side metal plate 11 and the thermal expansion coefficient between the ceramic substrate 10 and the heat-dissipation-side metal plate 12, and further due to the heat cycle load, at the end portion of the circuit-side metal plate 11 and the end portion of the heat-dissipation-side metal plate 12, stress concentration may occur on the surface of the ceramic substrate 10 to cause cracks to occur in the ceramic substrate 10. Therefore, measures have been taken to alleviate the stress concentration generated in the ceramic substrate 10 at the end portion of the circuit-side metal plate 11 and the end portion of the heat-dissipation-side metal plate 12 by forming side surfaces 11*a* and 12*a* of the circuit-side metal plate 11 and the heat-dissipation-side metal plate 12 into tapered surfaces, as illustrated in the insulating substrate 1 according to this embodiment, for example. Further, there has been also known a technique to improve the heat cycle characteristics by forming steps at end portions of the copper plate, for example. Whether or not the occurrence of cracks can be prevented in the ceramic substrate 10 of the insulating substrate 1 against such thermal stress and heat cycle load can be evaluated by the later-described furnace passing resistance of the insulating substrate 1 (alone).

However, it was found out that even when the above-described furnace passing resistance is satisfied, defects occur in the insulating substrate 1. That is, it was found out that in a state of the heat sink plate being soldered (a state of being incorporated in a semiconductor power module, for example), cracks may occur in the ceramic substrate 10 at an inner portion (bonding region) rather than at the end portion of the heat-dissipation-side metal plate 12. The present inventors examined the factors that cause cracks to occur in the ceramic substrate 10 at an inner portion relative to the end portion of the heat-dissipation-side metal plate 12. As a result, the present inventors found out that when solder comes into contact with the brazing material layer 14 when the heat sink plate is soldered to the heat-dissipation-side metal plate 12, dissolution of the brazing material layer 14 by solder, which means that the component forming the solder (for example, Sn) diffuses into the brazing material layer to form compounds with an element such as Ag or Cu forming the brazing material layer, occurs. Then, it was observed that due to the dissolution of the brazing material layer 14 by solder, cracks, which are considered to be caused by the formation of brittle compounds such as Cu—Sn in the brazing material layer 14, have occurred inside the brazing material layer 14 (in a direction substantially parallel to the bonding interface).

Furthermore, by cross-section analysis of the insulating substrate 1, the occurrence of a crack was observed in the thickness direction from one principal surface (surface) of the ceramic substrate 10 at an inner portion in the brazing material layer 14 relative to the end portion of the heat-dissipation-side metal plate 12 and at a tip portion of the crack in the brazing material layer 14. Further, when a stress analysis was performed based on a simulation, it was found out that when the aforementioned crack is present in the brazing material layer 14, stress concentration is confirmed to occur on the surface of the ceramic substrate 10 at the tip portion of the crack and due to this stress concentration, a crack occurs in the surface of the ceramic substrate 10. In recent years, the operating temperature of power modules has tended to increase, and further, the use of high-temperature solder with a large content of Sn has been increasing, and it is considered that the occurrence of cracks in the ceramic substrate 10 due to the aforementioned brazing material dissolution increases. The present invention was designed so that the Ni plating prevents the solder from coming into contact with the brazing material layer 14, thereby successfully inhibiting the occurrence of a crack in the aforementioned brazing material layer 14 and the occurrence of a crack in the ceramic substrate from the tip of the crack by avoiding the entry of Sn or the like into the brazing material layer 14.

Further, the crack in the aforementioned brazing material layer is prevented, thereby making it possible to inhibit deterioration of heat release ability of the insulating substrate.

Specifically, as illustrated in FIG. 1, the Ni plating layer 21 is provided to cover the end portion of the brazing material layer 14 exposed between the ceramic substrate 10 and the heat-dissipation-side metal plate 12. In the insulating substrate 1 according to this embodiment, the Ni plating layer 21 is provided to cover the end portion of the brazing material layer 14 exposed between the ceramic substrate 10 and the heat-dissipation-side metal plate 12 and a portion of the side surface 12*a* of the heat-dissipation-side metal plate 12. On the surface of the heat-dissipation-side metal plate 12 excluding the bonding surface (one surface) with the ceramic substrate 10, the remaining portion with no presence of the Ni plating layer 21 is in a state where the heat-dissipation-side metal plate 12 is exposed. That is, there is no Ni plating layer 21 on the other surface (lower surface in FIG. 1) of the heat-dissipation-side metal plate 12 and the side surface 12*a* of the heat-dissipation-side metal plate 12 excluding a portion of the side surface 12*a*, leaving the surface of the heat-dissipation-side metal plate 12 exposed.

In other words, the insulating substrate 1 is where there is provided a Ni-plated region where the Ni plating layer 21 covering the brazing material layer 14 exposed between the ceramic substrate 10 and the heat-dissipation-side metal plate 12 is formed and (the region excluding at least the periphery) of the other principal surface of the aforementioned heat-dissipation-side metal plate 12 is a non-Ni plated region where Ni plating is not formed.

If the entire surface of the heat-dissipation-side metal plate 12 is covered with Ni plating, the furnace passing resistance may deteriorate, and thus, the other principal surface of the heat-dissipation-side metal plate 12 should not be covered with Ni plating preferably.

Incidentally, the Ni plating layer 21 should have a function capable of preventing interdiffusion between the component (for example, Ag) in the brazing material layer and the solder component (for example, Sn) from the brazing material layer 14. The Ni plating layer in the present invention means a Ni plating layer or a Ni alloy plating layer, including Ni or Ni alloy plating such as an electro Ni plating layer, an electroless Ni—P plating layer, or an electroless Ni—B plating layer, for example.

Further, as illustrated in FIG. 1, a Ni plating layer 20 may be provided to cover an end portion of the brazing material layer 13 exposed between the ceramic substrate 10 and the circuit-side metal plate 11. In the insulating substrate 1 according to this embodiment, the Ni plating layer 20 is provided to cover (the end portion) of the brazing material layer 13 exposed between the ceramic substrate 10 and the circuit-side metal plate 11 and a portion of the side surface 11*a* of the circuit-side metal plate 11. On the surface of the circuit-side metal plate 11 excluding the bonding surface with the ceramic substrate 10, the remaining portion that is not covered with the Ni plating layer 20 is in a state where the surface of the circuit-side metal plate 11 is exposed. That is, there is no Ni plating layer 20 on the upper surface of the circuit-side metal plate 11 and the side surface 11*a* of the circuit-side metal plate 11 excluding a portion of the side surface 11*a*, leaving the surface of the circuit-side metal plate 11 exposed.

In the insulating substrate 1 according to the embodiment of the present invention, on the other side of the circuit-side metal plate 11 formed to have a predetermined circuit shape, an electronic component such as a semiconductor chip (not illustrated) is mounted by soldering or other means. Further, to the other surface of the heat-dissipation-side metal plate 12, the heat sink plate (base plate, not illustrated) made of Cu or Al having excellent thermal conductivity is soldered. Thus, a semiconductor power module or the like is fabricated.

In the insulating substrate 1 according to the embodiment of the present invention illustrated in FIG. 1, the end portion of the brazing material layer 13 exposed between the ceramic substrate 10 and the circuit-side metal plate 11 is covered with the Ni plating layer 20.

However, the brazing material layer 13 on the circuit side does not need to be covered with the Ni plating. This is because when an electronic component is soldered to the circuit-side metal plate 11 during the process of power module assembly, the possibility of the solder to adhere to the brazing material layer 13 on the circuit side is normally low.

As will be described later in examples, electroless plating (immersion plating) is preferably adopted for film-forming of the Ni plating because it is superior in terms of productivity and cost. When a plating resist is applied to the other principal surface (surface) of the circuit-side metal plate 11 and the other principal surface (surface) of the heat-dissipation-side metal plate 12 to prevent Ni plating from being applied thereto and then the electroless Ni plating is applied, characteristics such as furnace passing resistance and ultrasonic bondability of terminals improve because each of the surfaces is not covered with Ni plating. When this manufacturing method is used, the brazing material layer 13 on the circuit side is also covered with the Ni plating.

In the insulating substrate 1 according to the embodiment of the present invention, neither the circuit-side metal plate 11 nor the heat-dissipation-side metal plate 12 is entirely covered with Ni plating, so that the problem of a decrease in furnace passing resistance does not occur. The Ni plating has a higher hardness than the circuit-side metal plate 11 and the heat-dissipation-side metal plate 12 made of copper, aluminum, or the like, and furthermore, as in the electroless Ni—P plating, the hardness may increase due to thermal history such as soldering of a chip or a heat sink plate. The Ni plating having a high hardness degrades the furnace passing resistance. However, according to the present invention, the insulating substrate does not have a structure in which the entire metal plates (the other principal surface of the circuit-side metal plate and the other principal surface of the heat-dissipation-side metal plate) are covered with Ni plating, and thus, the problem of a decrease in furnace passing resistance caused by the Ni plating having a high hardness is not caused.

Further, in recent years, due to the progress of high-current power modules, as a technique of bonding between the aforementioned insulating substrate and a copper terminal (bus bar), which is a component of the power module, there are an increasing number of cases where a copper bus bar is ultrasonically bonded directly to the surface of a circuit plate of an insulating substrate in place of conventional solder bonding or Al wire bonding. In such ultrasonic bonding of a copper bus bar, in the case of the surface of the circuit metal plate being covered with Ni plating, the solid phase diffusion between the copper bus bar and the (copper) circuit plate of the insulating substrate was prevented, which could reduce the bonding strength between the copper bus bar and the insulating substrate. In the structure according to the embodiment of the present invention, there is no Ni plating layer on the surface where the copper bus bar is bonded to the upper surface of the circuit plate of the insulating substrate, and thus, the solid phase diffusion between copper of the copper bus bar and copper of the circuit is promoted during ultrasonic bonding of the copper bus bar, to obtain terminal bonding having a high bonding strength.

As above, according to the present invention, it is possible to provide an insulating substrate having excellent mountability (furnace passing resistance and ultrasonic bondability) during power module assembly and excellent heat cycle characteristics at high temperatures in a power module (structure in which an insulating substrate is soldered to a heat sink plate).

Figure 2:
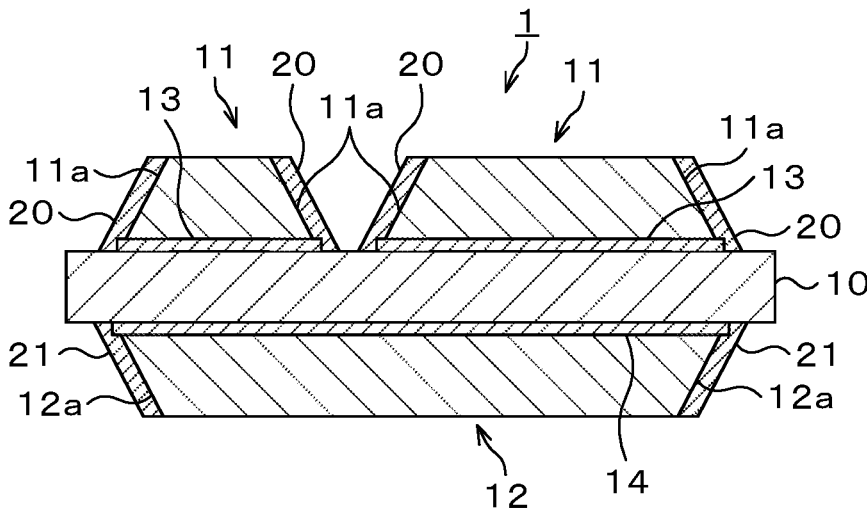
FIG. 2 is a cross-sectional view of an insulating substrate according to another embodiment of the present invention.
Figure 3:
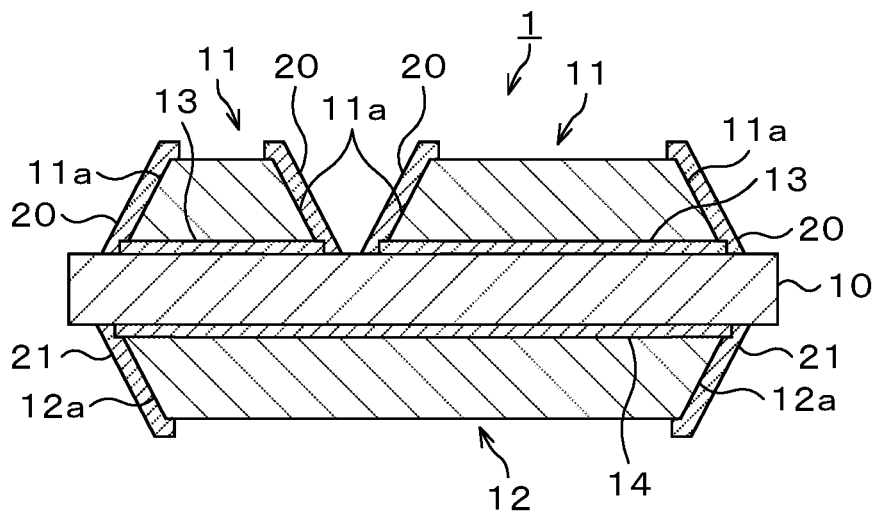
FIG. 3 is a cross-sectional view of an insulating substrate according to another embodiment of the present invention.

Incidentally, FIG. 1 illustrates the example where the Ni plating layer 20 is provided to cover the end portion of the brazing material layer 13 on the circuit side and a portion of the side surface 11*a* of the circuit-side metal plate 11 and the Ni plating layer 21 is provided to cover the end portion of the brazing material layer 14 on the heat dissipation side and a portion of the side surface 12*a* of the heat-dissipation-side metal plate 12, but as illustrated in FIG. 2, in addition to the end portions of the brazing material layers 13 and 14, the entire side surfaces 11*a* and 12*a* of the circuit-side metal plate 11 and the heat-dissipation-side metal plate 12 may be covered with the Ni plating layers 20 and 21 respectively. Further, as illustrated in FIG. 3, in addition to the side surfaces 11*a* and 12*a* of the circuit-side metal plate 11 and the heat-dissipation-side metal plate 12, up to a portion of the upper surface (a peripheral edge portion of the other principal surface) of the circuit-side metal plate 11 and up to a portion of the lower surface (a peripheral edge portion of the other principal surface) of the heat-dissipation-side metal plate 12 may be covered with the Ni plating layers 20 and 21 respectively.

A manufacturing method of an insulating substrate of the present invention includes: in the insulating substrate in which one principal surface of a heat-dissipation-side metal plate is bonded to one principal surface of a ceramic substrate via a brazing material layer provided therebetween and one principal surface of a circuit-side metal plate is bonded to the other principal surface of the ceramic substrate via a brazing material layer provided therebetween, forming a plating resist on the other principal surface of the aforementioned heat-dissipation-side metal plate (and preferably the other principal surface of the aforementioned circuit-side metal plate); and immersing the insulating substrate on which the aforementioned resist is formed in a plating solution to form a Ni plating layer on the brazing material layers exposed between the aforementioned ceramic substrate and the aforementioned heat-dissipation-side metal plate (and preferably between the aforementioned ceramic substrate and the aforementioned circuit-side metal plate) on which the resist is not formed and then peeling the aforementioned resist.

A portion or all of side surfaces of the aforementioned heat-dissipation-side metal plate and the aforementioned circuit-side metal plate may be covered with the aforementioned Ni plating layer, and the periphery of the other principal surface of the aforementioned heat-dissipation-side metal plate may be covered with the aforementioned Ni plating layer.

The aforementioned heat-dissipation-side metal plate and the aforementioned circuit-side metal plate are preferably a copper plate or a copper alloy plate, and the aforementioned brazing material layer preferably contains one metal component selected from Cu, Ag, and Sn and one active metal component selected from Ti, Hf, and Zr.

In the foregoing, the embodiment of the present invention has been described, but the present invention is not limited to such an example. It is apparent that those skilled in the art are able to devise various variation or modification examples within the scope of the technical spirit described in the claims, and it should be understood that such examples belong to the technical scope of the present invention as a matter of course.

EXAMPLE

Example 1

A commercially available aluminum nitride substrate having a size of 46 mm×48 mm×0.4 mm was prepared as the ceramic substrate. Further, an active-metal-containing brazing material paste was prepared by adding 83 mass % of silver powder, 10 mass % of copper powder, 5 mass % of tin powder, and 2 mass % of titanium powder (serving as an active metal component) (Ag:Cu:Sn:Ti=83:10:5:2) to a vehicle and kneading them, and the brazing material paste was screen-printed on both the entire surfaces of the ceramic substrate to have a thickness of 10 μm and then dried in the atmosphere to form brazing material layers. Then, two oxygen-free copper plates each having a size of 46 mm×48 mm×0.3 mm were placed in contact with the brazing material layers respectively to be heated to 850° C. in a vacuum furnace to bond the copper plates to the both surfaces of the aluminum nitride substrate, to then obtain a bonded body in which one surface of the copper plate for forming a heat-dissipation-side copper plate is bonded to (formed on) one surface of the aluminum nitride substrate and one principal surface of the copper plate for forming a circuit pattern is bonded to (formed on) the other principal surface of the aluminum nitride substrate.

Then, an ultraviolet curable alkaline-strippable resist having a predetermined circuit pattern shape was applied to the other principal surface (the surface opposite to the surface bonded to the ceramic substrate) of the copper plate for forming a circuit pattern of the bonded body by screen printing, and an ultraviolet curable alkaline-strippable resist having a rectangular shape of 45 mm×47 mm was applied to a center portion of the other principal surface (the surface opposite to the surface bonded to the ceramic substrate) of the copper plate for forming a heat-dissipation-side copper plate of the bonded body by screen printing. After the resists were irradiated with ultraviolet rays to be cured, the unnecessary portions of the copper plates were etched with an etching solution made of copper chloride, hydrochloric acid, and water as the balance, the resists were removed with an aqueous sodium hydroxide solution, and a circuit pattern (circuit-side copper plate) and a heat-dissipation-side copper plate, which were made of the copper plates, were formed.

Then, a fabricated product was immersed in dilute sulfuric acid for 20 seconds to be pickled, and immersed in an aqueous chelate solution containing 1.6 mass % of EDTA·4Na, 3 mass % of ammonia water (ammonia water containing 28 mass % of ammonia), and 5 mass % of hydrogen peroxide solution (hydrogen peroxide solution containing 35 mass % of hydrogen peroxide) at 20° C. for 20 minutes, and then, immersed in an aqueous chelate solution containing 2 mass % of ethylenetriaminepentaacetic acid (DTPA)·5Na and 5 mass % of hydrogen peroxide solution at 20° C. for 52 minutes, and thereby the unnecessary portions of the active-metal-containing brazing materials remaining between the copper circuit patterns on the surface of the ceramic substrate and around the heat-dissipation-side copper plate were removed to obtain an intermediate product of an insulating substrate.

Then, the aforementioned intermediate product was immersed in a chemical polishing solution made of 14 mass % of sulfuric acid, 3.2 mass % of hydrogen peroxide, and water as the balance at 45° C. for 5 minutes to remove the surfaces of the circuit-side copper plate and the heat-dissipation-side copper plate by chemical polishing to cause the active-metal-containing brazing materials to protrude about 0.3 mm from side surface portions of the circuit-side copper plate and the heat-dissipation-side copper plate, to complete the process of forming the circuit-side copper plate and the heat-dissipation-side copper plate each having a predetermined shape.

Then, in order to apply Ni plating to a predetermined region, an ultraviolet curable alkaline-strippable resist was applied to the entire principal surfaces of the circuit-side copper plate and the heat-dissipation-side copper plate by screen printing, the resists were irradiated with ultraviolet rays to be cured, and thereby only the principal surfaces of the respective copper plates were covered with a resist film.

Then, after electroless Ni—P plating was applied to the resist-film-attached bonded body to form a plating film having a thickness of 4 μm, the resists were removed with an aqueous sodium hydroxide solution to obtain a metal-ceramic insulating substrate with the brazing material layer exposed between the ceramic substrate and the heat-dissipation-side copper plate, the brazing material layer exposed between the ceramic substrate and the circuit-side copper plate, and the side surfaces of the respective copper plates covered with a Ni plating layer. Incidentally, no Ni plating layer is formed on the other principal surfaces of the circuit-side metal plate and the heat-dissipation-side metal plate.

The metal-ceramic insulating substrate fabricated as above was subjected to the following "brazing material dissolution evaluation," "furnace passing resistance evaluation," and "ultrasonic bondability evaluation."
"Brazing Material Dissolution Evaluation"

First, a Sn-5.0Sb solder paste containing flux (ECO SOLDER M10 manufactured by SENJU METAL INDUSTRY CO., LTD.) was applied to a center portion of the surface of a copper base plate (heat sink plate) having a size of 120 mm×60 mm×3 mm to have a paste thickness of 300 μm in the same shape as the outer shape of the insulating substrate (46 mm×48 mm) using a metal mask.

Then, the previously-described metal-ceramic insulating substrate was mounted on this solder paste, the temperature was raised to 270° C. in an $N_2$ atmosphere, and then, while maintaining the temperature to 270° C., evacuation was performed for 3 minutes and then the temperature was lowered, and thereby the metal-ceramic insulating substrate was soldered to the copper base plate (heat sink plate). The thickness of the solder after the soldering was 200 μm.

Of the base-plate-attached insulating substrate obtained as above, a cross-sectional observation sample was prepared, and element mapping was performed by a scanning electron microscope (SEM/EDS) equipped with an energy dispersive X-ray analyzer to confirm the presence or absence of occurrence of brazing material dissolution. As a result, in the metal-ceramic insulating substrate fabricated in Example 1, it was confirmed from the element mapping by SEM/EDS that Sn, or the like, being the solder component, does not diffuse into the brazing material layer side in the brazing material layer of the insulating substrate with the Ni—P plating covering the brazing material layer and no brittle Cu—Sn compounds are formed (the brazing material dissolution does not occur).

"Furnace Passing Resistance Evaluation"

Then, in order to evaluate the furnace passing resistance, a heat load was applied to four metal-ceramic insulating substrates (each having no base plate soldered) in this example by allowing each of the metal-ceramic insulating substrates to pass through a furnace three times (performing a treatment of heating at 350° C. for 10 minutes under a reducing atmosphere (hydrogen/nitrogen=20/80) followed by cooling to room temperature three times repeatedly). After the furnace passing was performed three times, the entire substrate was inspected for the presence or absence of cracks in the ceramic part using an optical microscope. It was confirmed that the metal-ceramic insulating substrate in this example has no occurrence of cracks after passing through a furnace three times, and has high furnace passing resistance.

"Ultrasonic Bondability Evaluation"

Next, in order to evaluate the ultrasonic bondability, a copper terminal (with an ultrasonic bonding surface having a size of 5 mm×5 mm, and a thickness of 1 mm) was ultrasonically bonded to the metal-ceramic insulating substrate in this example using an ultrasonic bonding apparatus, and then the bonding area ratio of an ultrasonic bonding portion was evaluated by an ultrasonic flaw detection image and the shear strength was evaluated by a shear strength measuring device. Of the metal-ceramic insulating substrate in this example, the bonding area ratio was 70% or more and the shear strength was 1500 N or more, resulting in that good ultrasonic bondability was exhibited. Further, when the SEM/EDS observation was performed on the cross section of the ultrasonic bonding portion, it was also confirmed that the copper terminal part and the copper circuit part of the insulating substrate are integrated.

Comparative Example 1

Figure 4:
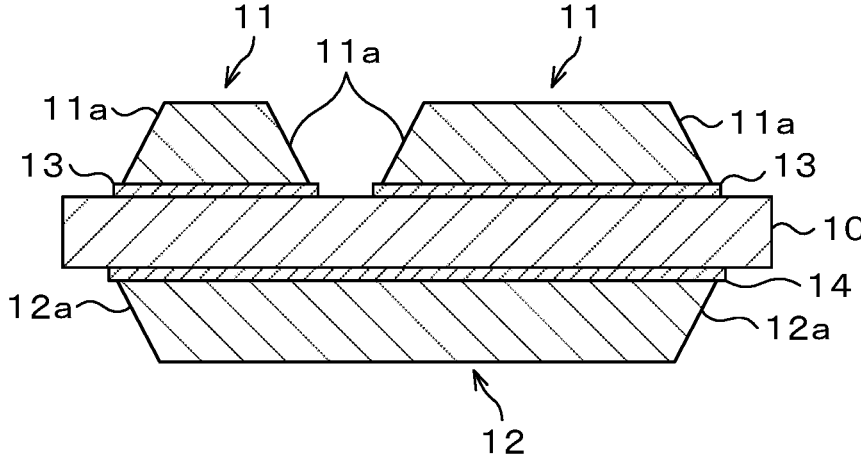
FIG. 4 is a cross-sectional view of an insulating substrate according to Comparative example 1 including no Ni plating layer.

As illustrated in FIG. 4, a metal-ceramic insulating substrate in Comparative Example 1 was obtained by the same method as in Example 1, except that the resist printing process (for partial Ni plating) and the electroless Ni—P plating process were not performed after the circuit-side copper plate and the heat-dissipation-side copper plate were formed, and the Ni plating layers were not present at all.

This metal-ceramic insulating substrate was subjected to the "brazing material dissolution evaluation," the "furnace passing resistance evaluation," and the "ultrasonic bondability evaluation" by the same methods as in Example 1.

"Brazing Material Dissolution Evaluation"

In the metal-ceramic insulating substrate fabricated in Comparative example 1, it was confirmed from the element mapping by SEM/EDS that the solder used for soldering the base is wet and spreads to the side surface of the heat-dissipation-side copper plate, the brazing material layer exposed between the ceramic substrate and the heat-dissipation-side copper plate and the solder are in contact with each other, Sn or the like being the solder component diffuses into the brazing material layer side in the brazing material layer of the insulating substrate, and brittle Cu—Sn compounds are formed in the brazing material layer (the brazing material dissolution has occurred).

"Furnace Passing Resistance Evaluation"

It was confirmed that the metal-ceramic insulating substrate in Comparative example 1 has no occurrence of cracks after passing through a furnace three times, and has high furnace passing resistance.

"Ultrasonic Bondability Evaluation"

Of the metal-ceramic insulating substrate in Comparative example 1, the bonding area ratio of an ultrasonic bonding portion was 70% or more and the shear strength was 1500 N or more, resulting in that good ultrasonic bondability was exhibited. Further, when the SEM/EDS observation was performed on the cross section of the ultrasonic bonding portion, it was also confirmed that the copper terminal part and the copper circuit part of the insulating substrate are integrated.

Comparative Example 2

Figure 5:
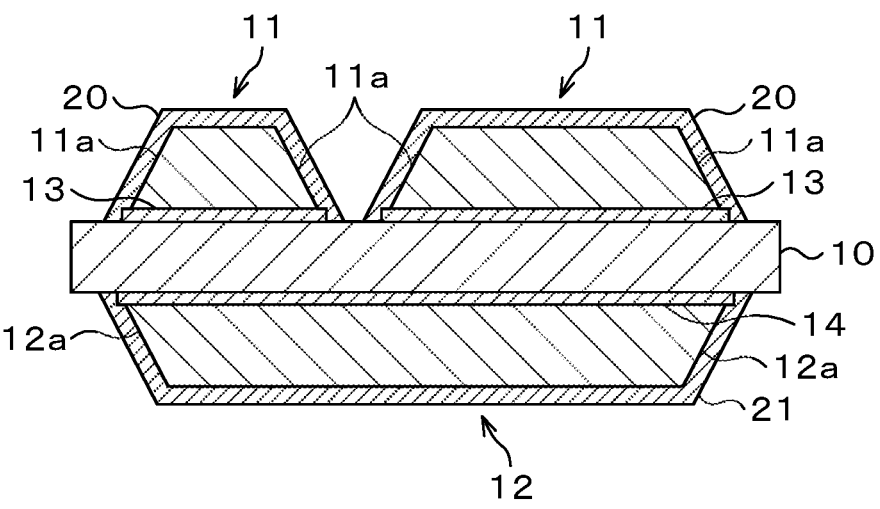
FIG. 5 is a cross-sectional view of an insulating substrate according to Comparative example 2 in which the entire copper plate is covered with a Ni plating layer.

As illustrated in FIG. 5, a metal-ceramic insulating substrate in Comparative example 2 was obtained by the same method as in Example 1, except that the resist printing process (for partial Ni plating) was not performed after the circuit-side copper plate and the heat-dissipation-side copper plate were formed and the surfaces of the circuit-side copper plate and the heat-dissipation-side copper plate of the insulating substrate were covered with a Ni—P plating layer having a thickness of 4 μm.

This metal-ceramic insulating substrate was subjected to the "brazing material dissolution evaluation," the "furnace passing resistance evaluation," and the "ultrasonic bondability evaluation" by the same methods as in Example 1.

"Brazing Material Dissolution Evaluation"

In the metal-ceramic insulating substrate fabricated in Comparative example 2, it was confirmed from the element mapping by SEM/EDS that with the Ni—P plating covering the brazing material layers, Sn or the like being the solder component does not diffuse into the brazing material layer side in the brazing material layer of the insulating substrate and no brittle Cu—Sn compounds are formed (the brazing material dissolution does not occur).

"Furnace Passing Resistance Evaluation"

In two out of the four metal-ceramic insulating substrates in Comparative example 2, cracks occurred in the ceramic part after passing through a furnace three times, resulting in that the furnace passing resistance was low.

"Ultrasonic Bondability Evaluation"

Of the metal-ceramic insulating substrate in this comparative example, the bonding area ratio of an ultrasonic bonding portion was 50% and the shear strength was low, which was 600 N, resulting in that the ultrasonic bondability was poor. Further, when the SEM/EDS observation was performed on the cross section of the ultrasonic bonding portion, it was confirmed that the copper terminal part and the copper circuit part of the insulating substrate are not integrated because there is a place where the Ni—P plating coating remains between the copper terminal part and the copper circuit part of the insulating substrate.

The results of Example 1 and Comparative examples 1 and 2 are illustrated in Table 1 in a summarized manner.

TABLE 1

| | Ni PLATING FORMED PORTION | BRAZING MATERIAL DISSOLUTION | FURNACE PASSING RESISTANCE (PASSING THROUGH FURNACE THREE TIMES) | ULTRASONIC BONDABILITY |
|---|---|---|---|---|
| EXAMPLE 1 | BRAZING MATERIAL LAYER, SIDE SURFACES OF CIRCUIT-SIDE METAL PLATE AND HEAT-DISSIPATION-SIDE METAL PLATE (NO Ni PLATING ON THE OTHER PRINCIPAL SURFACE) | ABSENT | GOOD (CRACK RATIO r/n = 0/4) | GOOD (BONDING AREA 70% OR MORE, SHEAR STRENGTH 1500N OR MORE) |
| COMPARATIVE EXAMPLE 1 | NO PLATING | PRESENT | GOOD (CRACK RATIO r/n = 0/4) | GOOD (BONDING AREA 70% OR MORE, SHEAR STRENGTH 1500N OR MORE) |
| COMPARATIVE EXAMPLE 2 | BRAZING MATERIAL LAYER, CIRCUIT-SIDE METAL PLATE AND HEAT-DISSIPATION-SIDE METAL PLATE (THE OTHER PRINCIPAL SURFACE AND SIDE SURFACE) | ABSENT | POOR (CRACK RATIO r/n = 2/4) | POOR (BONDING AREA 50%, SHEAR STRENGTH 600N) |

When the Ni plating layer is formed on the entire surfaces of the circuit-side metal plate (circuit-side copper plate) and the heat-dissipation-side metal plate (heat-dissipation-side copper plate) of the insulating substrate, the aforementioned brazing material dissolution does not occur because the Ni plating layer prevents interdiffusion between Ag in the brazing material layer and Sn derived from the solder. However, when the Ni plating layer is formed on the entire surfaces of the circuit-side metal plate (circuit-side copper plate) and the heat-dissipation-side metal plate (heat-dissipation-side copper plate) of the insulating substrate, there is a problem that the presence of the Ni plating layer having a high hardness reduces the reliability (furnace passing resistance) against the heat load that the insulating substrate receives during power module assembly. Further, there is also an application of ultrasonically bonding a copper terminal to the surface of the circuit metal plate (circuit-side copper plate) of the insulating substrate, and in this case, the surface to which the copper terminal is bonded is preferably copper that has not been Ni plated.

INDUSTRIAL APPLICABILITY

The present invention can be used for an insulating substrate to be used for a semiconductor power module, and the like, for example.

EXPLANATION OF CODES 1 insulating substrate
10 ceramic substrate
11 circuit-side metal plate (circuit-side copper plate)
12 heat-dissipation-side metal plate (heat-dissipation-side copper plate)
13, 14 brazing material layer
11a, 12a side surface
20, 21 Ni plating layer

What is claimed is:

1. An insulating substrate in which one principal surface of a heat-dissipation-side metal plate is brazed to one principal surface of a ceramic substrate via a brazing material layer provided therebetween, wherein
   the brazing material layer protrudes past an end portion of the heat-dissipation-side metal plate in a direction parallel to the one principal surface of the heat-dissipation-side metal plate,
   a Ni plating layer that covers a surface of the brazing material layer that protrudes past the end portion of the heat-dissipation-side metal plate,
   at least a portion of another principal surface of the heat-dissipation-side metal plate is not covered with a Ni plating layer, leaving at least a portion of the another principal surface of the heat-dissipation-side metal plate exposed,
   the another principal surface of the heat-dissipation-side metal plate is opposite from the one principal surface of the heat-dissipation-side metal plate in the direction parallel to the one principal surface of the heat-dissipation-side metal plate, and
   the another principal surface of the heat-dissipation-side metal plate is directly bonded to a heat sink.

2. The insulating substrate according to claim 1, wherein a portion or all of a side surface of the heat-dissipation-side metal plate is covered with the Ni plating layer.

3. The insulating substrate according to claim 1, wherein a portion of a periphery of the another principal surface of the heat-dissipation-side metal plate is covered with the Ni plating layer.

4. The insulating substrate according to claim 1, wherein one principal surface of a circuit-side metal plate is brazed to another principal surface of the ceramic substrate via another brazing material layer provided therebetween.

5. The insulating substrate according to claim 4, wherein the circuit-side metal plate is a copper plate or a copper alloy plate.

6. The insulating substrate according to claim 1, wherein the heat-dissipation-side metal plate is a copper plate or a copper alloy plate.

7. A manufacturing method of an insulating substrate, comprising: in the insulating substrate in which one principal surface of a heat-dissipation-side metal plate is bonded to one principal surface of a ceramic substrate via a brazing material layer provided therebetween that protrudes past an end portion of the heat-dissipation-side metal plate in a direction parallel to the one principal surface of the heat-dissipation-side metal plate and one principal surface of a circuit-side metal plate is bonded to another principal surface of the ceramic substrate via another brazing material layer provided therebetween,
   forming a plating resist on another principal surface of the heat-dissipation-side metal plate, wherein the another principal surface of the heat-dissipation-side metal plate is opposite from the one principal surface of the heat-dissipation-side metal plate in the direction parallel to the one principal surface of the heat-dissipation-side metal plate, and wherein the another principal surface of the heat-dissipation-side metal plate is directly bonded to a heat sink; and immersing the insulating substrate on which the plating resist is formed in a Ni plating solution to form a Ni plating layer on a surface of the brazing material layer that protrudes past the end portion of the heat-dissipation-side metal plate on which the plating resist is not formed and then peeling the plating resist.

8. The manufacturing method of the insulating substrate according to claim 7, wherein a portion or all of a side surface of the heat-dissipation-side metal plate is covered with the Ni plating layer.

9. The manufacturing method of the insulating substrate according to claim 7, wherein a periphery of the another principal surface of the heat-dissipation-side metal plate is covered with the Ni plating layer.

10. The manufacturing method of the insulating substrate according to claim 7, further comprising:

forming a plating resist on the another principal surface of the circuit-side metal plate to form a Ni plating layer on the another brazing material layer exposed between the ceramic substrate and the circuit-side metal plate.

11. The manufacturing method of the insulating substrate according to claim 7, wherein a portion or all of a side surface of the circuit-side metal plate is covered with the Ni plating layer.

12. The manufacturing method of the insulating substrate according to claim 7, wherein the heat-dissipation-side metal plate and the circuit-side metal plate each are a copper plate or a copper alloy plate.

13. The manufacturing method of the insulating substrate according to claim 7, wherein the brazing material layer contains one metal component selected from Cu, Ag, and Sn, and contains one active metal component selected from Ti, Hf, and Zr.

14. The insulating substrate according to claim 1, wherein each side surface of the heat-dissipation-side metal plate is tapered.

15. The insulating substrate according to claim 1, wherein a topmost surface of the Ni plating layer is not co-planar with the one principal surface of the heat-dissipation-side metal plate.

16. The manufacturing method of the insulating substrate according to claim 7, wherein each side surface of the heat-dissipation-side metal plate is tapered.

17. The manufacturing method of the insulating substrate according to claim 7, wherein a topmost surface of the Ni plating layer is not co-planar with the one principal surface of the heat-dissipation-side metal plate.

*    *    *    *    *